United States Patent [19]
Jao et al.

[11] Patent Number: 5,885,862
[45] Date of Patent: Mar. 23, 1999

[54] POLY-LOAD RESISTOR FOR SRAM CELL

[75] Inventors: Kuo-Hao Jao, Mao-Li Hsien; Yung-Shun Chen, Taipei, both of Taiwan

[73] Assignee: Winbond Electronics Corp., Taiwan

[21] Appl. No.: 81,399

[22] Filed: May 19, 1998

Related U.S. Application Data

[62] Division of Ser. No. 671,362, Jun. 27, 1996.

[51] Int. Cl.$^6$ .......................... H01L 21/70; H01L 21/8244
[52] U.S. Cl. ........................... 438/238; 438/384; 438/385
[58] Field of Search .................................... 438/210, 213, 438/238, 279, 383, 384, 385, 514, 529, 941; 257/380, 383, 538

[56] References Cited

U.S. PATENT DOCUMENTS

| | | | |
|---|---|---|---|
| 4,968,645 | 11/1990 | Baldi et al. | 438/385 |
| 5,236,851 | 8/1993 | Kameyama et al. | 438/238 |
| 5,348,901 | 9/1994 | Chen et al. | 438/385 |
| 5,594,269 | 1/1997 | Spinner, III et al. | 257/380 |
| 5,622,884 | 4/1997 | Liu | 438/238 |
| 5,686,338 | 11/1997 | Liu | 438/384 |
| 5,705,418 | 1/1998 | Liu | 438/383 |

FOREIGN PATENT DOCUMENTS

| | | | |
|---|---|---|---|
| 362174968 A | 7/1987 | Japan | 257/904 |
| 405090539 | 4/1993 | Japan | 257/904 |

*Primary Examiner*—Olik Chaudhuri
*Assistant Examiner*—Anh D. Mai
*Attorney, Agent, or Firm*—Proskauer Rose

[57] ABSTRACT

The inventive SRAM cell has a poly-load resistor which comprises a thick supply voltage (Vcc) interconnect, a thick driver interconnect on a thin load resistance region which is electrically connected to both interconnects. The novel poly-load resistor overcomes the problem of lateral diffusion from the interconnect regions into the load region. The resulting SRAM cell has a low Vcc interconnect resistance.

15 Claims, 5 Drawing Sheets

POLY-LOAD RESISTOR FOR SRAM CELL

RELATED APPLICATION

This application is a divisional application of U.S. patent application Ser. No. 08/671,362, entitled, "Poly Load Resistor for SRAM Cell", filed Jun. 27, 1996 still pending.

FIELD OF THE INVENTION

The present invention relates to an SRAM cell with a poly-load resistor. The poly-load resistor has a thick Vcc interconnect region, a thick driver drain interconnect region and a thin poly-load region. The inventive poly-load resistor has low interconnect resistance and suppresses lateral diffusion of impurities from the interconnect regions into the load region. The invention also relates to a method for making the inventive poly-load resistor without using additional photolithography steps over those used in conventional SRAM cells with poly-load resistors.

BACKGROUND OF THE INVENTION

FIG. 1 schematically illustrates an SRAM cell 110. The SRAM cell 110 comprises first and second drivers N1 and N2. Illustratively, the drivers N1 and N2 are pulldown NMOS devices N1 and N2. The source of N1 112 and the source of N2 114 are connected to a reference voltage Vss which, for example, is ground. The drain 116 of N2 is connected to the gate 118 of N11. The drain 120 of N1 is connected to the gate 122 of N2. The SRAM cell 110 of FIG. 1 also comprises two load devices L1 and L2. The load devices L1 and L2 each have one terminal 124, 126 connected to a supply voltage Vcc and another terminal 128, 130 connected to the drains 120, 116 of N1 and N2, respectively. The supply voltage Vcc is positive with respect to Vss.

The SRAM cell 110 also comprises two additional NMOS devices N3 and N4. The devices N3 and N4 are pass transistors. The gates 132, 134 of N3 and N4 are connected to a wordline whose signal value is designated WORD. The drains 136, 138 of N3 and N4 are connected to bit lines whose signal values are designated BIT and $\overline{\text{BIT}}$, respectively. The sources 140, 142 of N3 and N4 are connected the drains 120, 116 of N1 and N2, respectively.

To write the cell, DATA (logic "1" or logic "0") is placed on the BIT line and $\overline{\text{DATA}}$ is placed on the $\overline{\text{BIT}}$ line. Then WORD is asserted. A read operation commences by precharging the BIT and $\overline{\text{BIT}}$ lines. The WORD line is asserted and either the BIT or $\overline{\text{BIT}}$ line will be discharged by one of the pull down transistors N1 or N2.

The purpose of the load devices L1 and L2 is to counteract the effect of charge leakage at the drains 120, 116 of N1 and N2. The load devices L1 and L2 may be polycrystalline silicon resistors.

A row 45 of SRAM cells 50 is shown in FIG. 2, where one of the SRAM cells 50 is shown in greater detail. The load devices of the SRAM cell 50 are polysilicon load resistors $L_1$ and $L_2$. Parasitic resistance Rvcc form the interconnect resistance between Vcc and the load devices $L_1$ and $L_2$ of the cells 50. As shown in FIG. 2, each cell 50 in the row 45 has associated with it an additional unit of parasitic resistance Rvcc. The Vcc interconnect parasitic resistance of each cell 50 is made up of one or more units of Rvcc as shown in FIG. 2. The actual voltage level of the "high" supply voltage received at the cell 50 will be much lower than Vcc if Rvcc is high or if the aggregate interconnect resistance from the Vcc pin to the cell 50 is high (i.e., if the total resistance of multiple internal parasitic resistance Rvcc from the Vcc pin to a specific cell 50 is high). Such a reduction in voltage level in the high supply voltage received at the cell 50 reduces the performance of the cell 50. Therefore, it is desirable for the Vcc interconnect resistance for each cell 50 to be as small as possible.

Lowering the value of the Vcc interconnect parasitic resistance Rvcc reduces the voltage drop between Vcc and the loads $L_1$ and $L_2$. This enhances circuit operation and reduces wasted power.

FIG. 3 shows a structure used to implement one leg of a conventional SRAM structure such as shown in FIG. 1. The structure 1 of FIG. 3 comprises a substrate 10 which is, for example, a P-type substrate. A driver device 12 is formed in the substrate 10. The driver device 12 is an NMOSFET and comprise N+ type drain region 14 and N+ type source region 16 which are separated by a channel 18. A thin gate oxide layer 20 is formed over the channel 18. A polysilicon gate 22 is formed over the gate oxide 20.

An inter-poly-dielectric layer (IPD) 30 is formed over the driver device 12. The (IPD) layer has a thickness of 1500 Å–2000 Å. A thick polysilicon layer 80 is formed on the IPD layer 30. A region 82 of the polysilicon layer 80 is heavily doped (N+ type) to form a low resistance Vcc interconnect. A region 84 of the layer 80 is heavily doped (N+ type) to form a low resistance interconnect to the drain region 14 of the driver device. This driver interconnect (also known as poly-2/poly-1 via) extends through a via opening 32 in the IPD layer 30. A region 86 of the polysilicon layer 80 is lightly doped (N-type) to form a poly-load resistance region. (There is also an additional via opening in the IPD layer 30 (not shown) for connecting the interconnect 84 to the gate of another driver.)

A problem with this structure is lateral diffusion from the heavily doped regions 82 and 84 into the lightly doped region 86.

Accordingly, it is an object of the invention to provide an SRAM cell with a poly-load resistor structure which overcomes the problems of the prior art.

Specifically, it is an object of the invention to provide an SRAM cell with a poly-load resistor structure in which lateral diffusion from highly doped interconnect regions into a lightly doped poly-load region is reduced. It is also an object of the invention to provide a method for fabricating such a poly-load resistor structure without increasing the number of photolithographic steps over the number of photolithographic steps used in the prior art.

SUMMARY OF THE INVENTION

The inventive SRAM cell has a poly-load resistor which comprises a thick Vcc interconnect region, a thick driver interconnect region and a thin poly-load resistance region which is electrically connected to both interconnects. The novel poly-load resistor overcomes the problem of lateral diffusion from the interconnect regions into the load region. The resulting SRAM cell has a Vcc interconnect with a low parasitic resistance.

A method for forming a load resistor for an SRAM cell in accordance with an illustrative embodiment of the invention comprises the steps of:

(a) Forming an inter-poly-dielectric layer (IPD) over a driver device in a semiconductor substrate and patterning the IPD to form one or more via openings therein.

(b) Depositing a thick polysilicon layer on the IPD.

(c) Uniformly doping the thick polysilicon layer with a first ion implantation.

(d) Patterning the thick polysilicon region to form a supply voltage interconnect (Vcc interconnect) and a driver interconnect which connects to the drain of one driver to the gate of another driver (i.e., the other driver of the cell) through the via holes in the IPD. The thick polysilicon layer is removed between the Vcc interconnect and the driver interconnect where the thin load resistance region is to be formed.

(e) Depositing a thin polysilicon layer over the Vcc interconnect and driver interconnect and over the exposed IPD between the Vcc interconnect and driver interconnect.

(f) Uniformly doping the thin polysilicon layer with a second ion implantation to form a load resistance region which is in electrical contact with the Vcc and driver interconnects.

Illustratively, the first ion implantation has a larger flux density than the second ion implantation so that the thick polysilicon layer has a greater dopant concentration than the thin polysilicon layer.

This thin polysilicon layer may be patterned using photolithography and etching after it is doped. (The thick polysilicon layer may also illustratively be patterned in the same step.) It should be noted that the inventive method for making the poly-load resistor structure does not require more masking steps than the method used to make the conventional poly-load resistor structure.

DETAILED DESCRIPTION OF THE INVENTION

Figure 1:
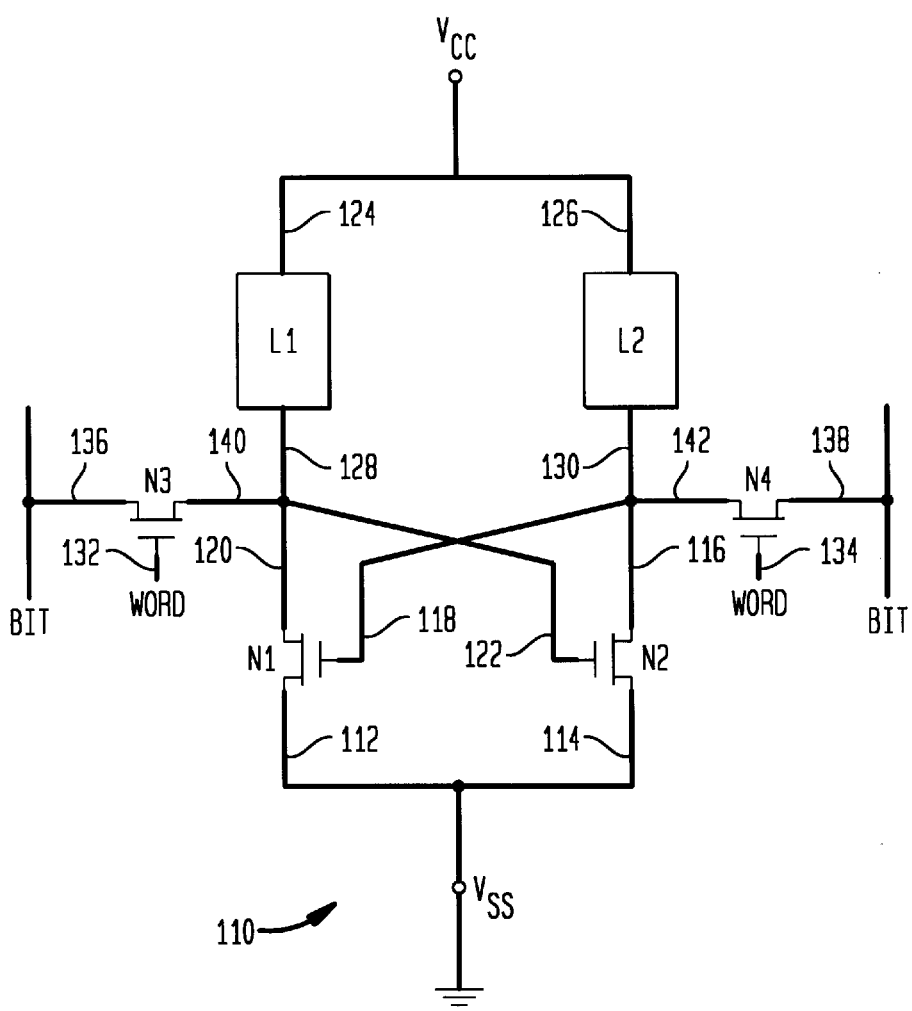
FIG. 1 schematically illustrates a conventional SRAM cell.
Figure 2:
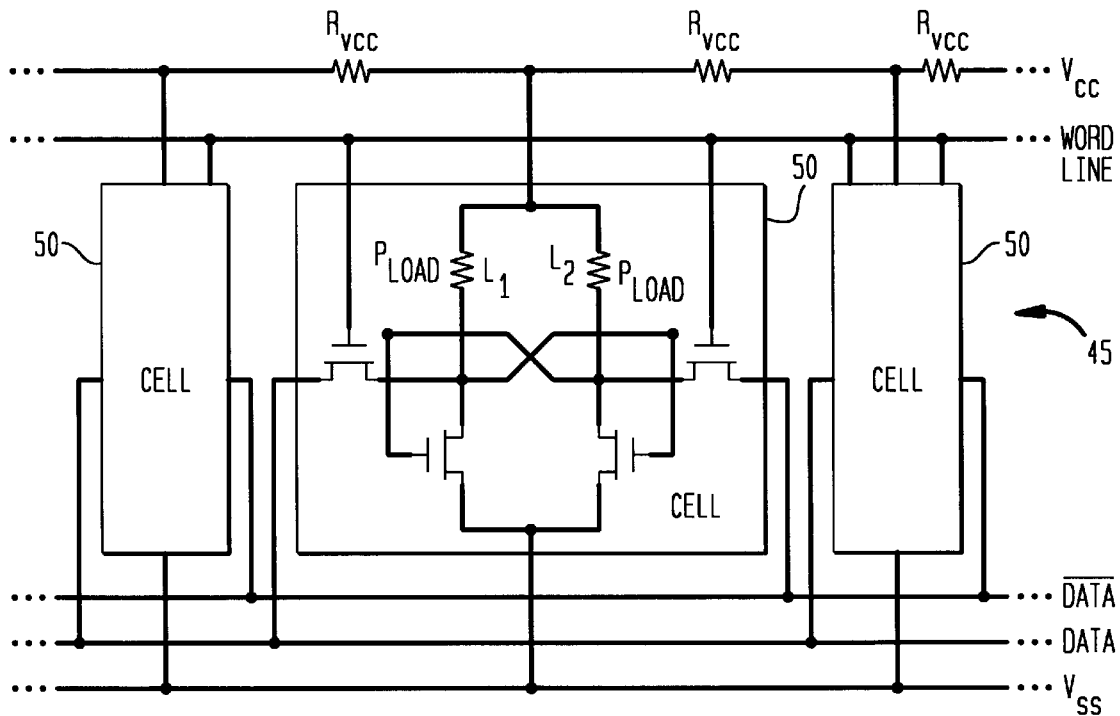
FIG. 2 schematically illustrates a row of SRAM cells of the type shown in FIG. 1.
Figure 3:
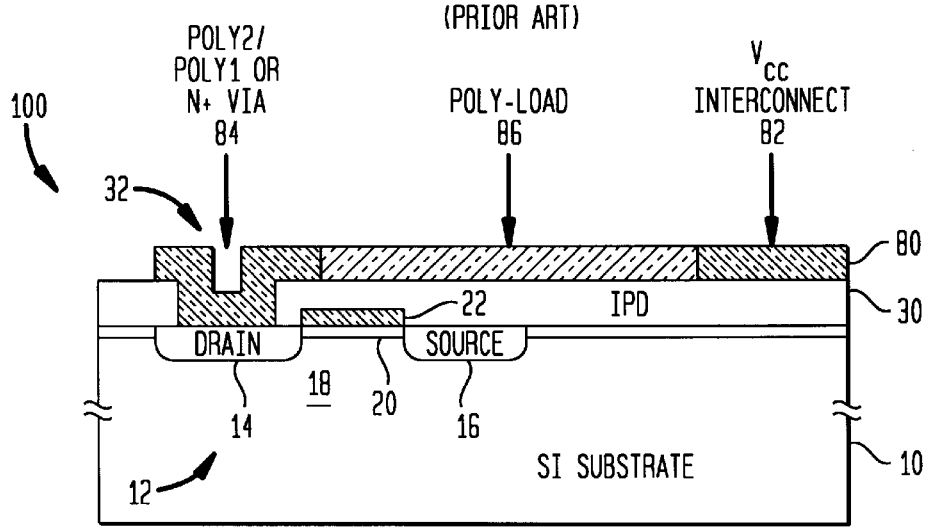
FIG. 3 shows the structure of a conventional poly-load resistor for use in an SRAM cell of type shown in FIG. 1.
Figure 4:
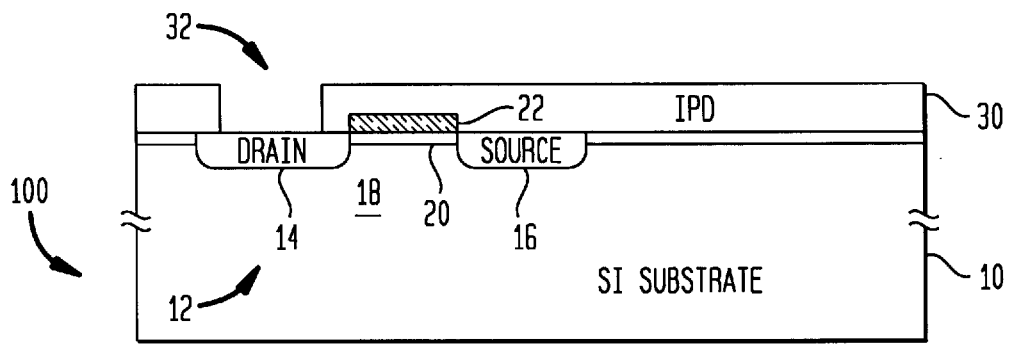
FIGS. 4–8 illustrates the fabrication of a poly-load resistor for use in an SRAM cell in accordance with an illustrative embodiment of the invention.

The fabrication of a polysilicon load resistor for an SRAM cell in accordance with an illustrative embodiment of the invention is shown in FIGS. 4–8. FIG. 4 shows a semiconductor structure 100. The structure 100 comprises a P-type substrate 10. (Instead of a P-type substrate, an N-type substrate with a P-well may be utilized.) Illustratively, an NMOS driver device 12 has been formed in the substrate.

The driver device 12 comprises an N-type drain region 14 and an N-type source region 16. The drain 14 and source 16 are separated by a channel 18. A gate oxide 20 and polysilicon gate 22 are formed on top of the channel 18. The polysilicon gate 22 is formed by depositing and patterning a polysilicon layer (poly 1).

The driver device 12 is covered with an inter-poly-dielectric (IPD) layer 30. Illustratively, the IPD layer is formed from TEOS and has a thickness of 1500 Angstroms to 2000 Angstroms. The IPD layer 30 is patterned using photolithography and etching to form a via opening 32. The via opening 32 is formed in the IPD layer 30 to permit a subsequently formed poly-load resistor to contact with drain 14 of the driver. (Another via opening may be formed in the IPD layer 30 to permit the poly-load resistor to contact the gate of another driver, namely, the other driver of the cell (not shown in FIG. 4). Likewise, the gate 22 is connected by way of another via opening, (in a different cross-sectional plane) to the drain of the other diver not shown in FIG. 4.)

Figure 5:
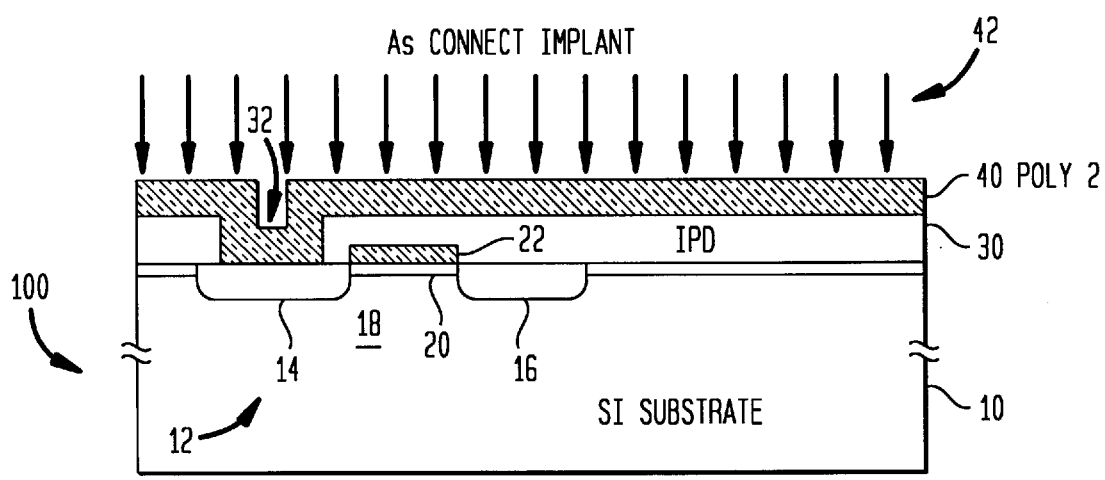

As shown in FIG. 5, a thick polysilicon (poly-2) layer 40 is deposited on the IPD layer 30 and in the via opening 32. The poly-2 layer 40 has a thickness of about 1000 Angstroms. The poly-2 layer 40 is doped to be N+ type using ion implantation as indicated by the arrows 42. Arsenic atoms are implanted with an energy of 80 kev and a flux density equal to or greater than $10^{15}/cm^2$.

Figure 6:
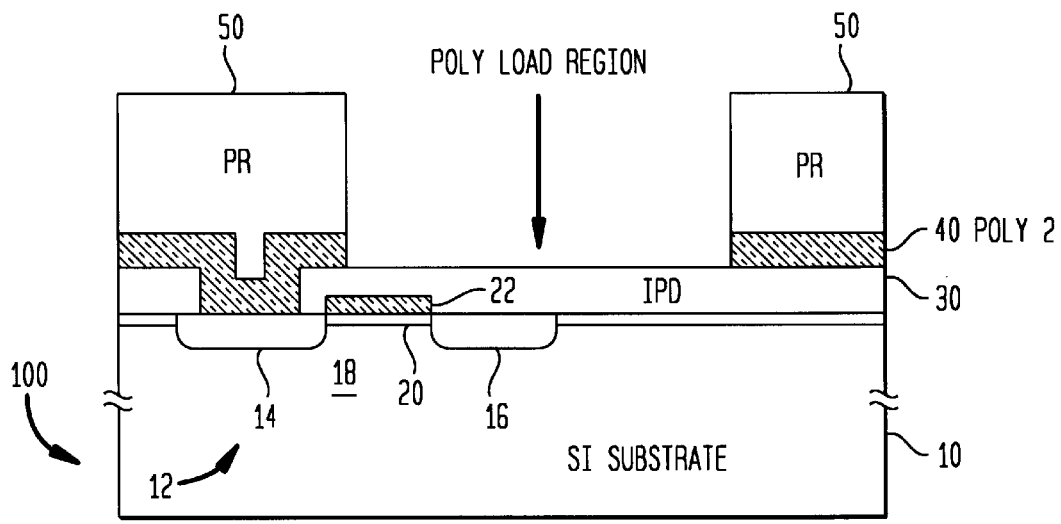

Next, as shown in FIG. 6, a photoresist mask 50 is formed on the thick poly-2 layer 40. Using an etching process, the portion of the poly-2 layer 40 not covered by the mask 50 is removed. Illustratively, the etchant is $Cl_2$ and the IPD layer 30 acts as an etching stop.

Figure 7:
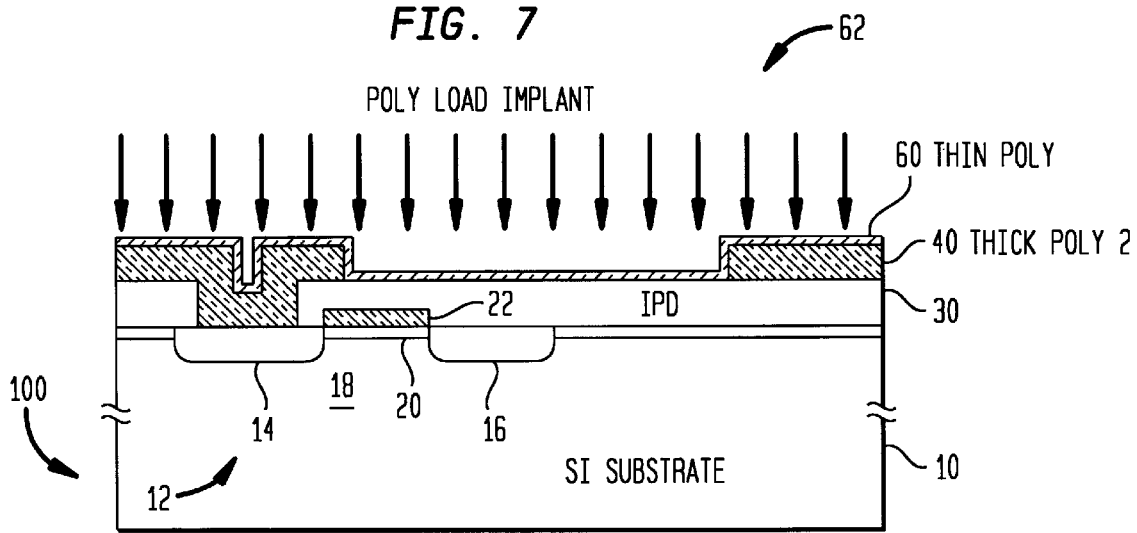

As shown in FIG. 7, a thin polysilicon layer 60 is then deposited on the surface of the structure 100. The thin polysilicon layer 60 has a thickness of about 200 Angstroms. The thin polysilicon layer is doped to be N-type using a second ion implantation step as indicated by the arrows 62. Arsenic ions are implanted with an energy of 40 kev and a flux density of $10^{14}/cm^2$.

Figure 8:
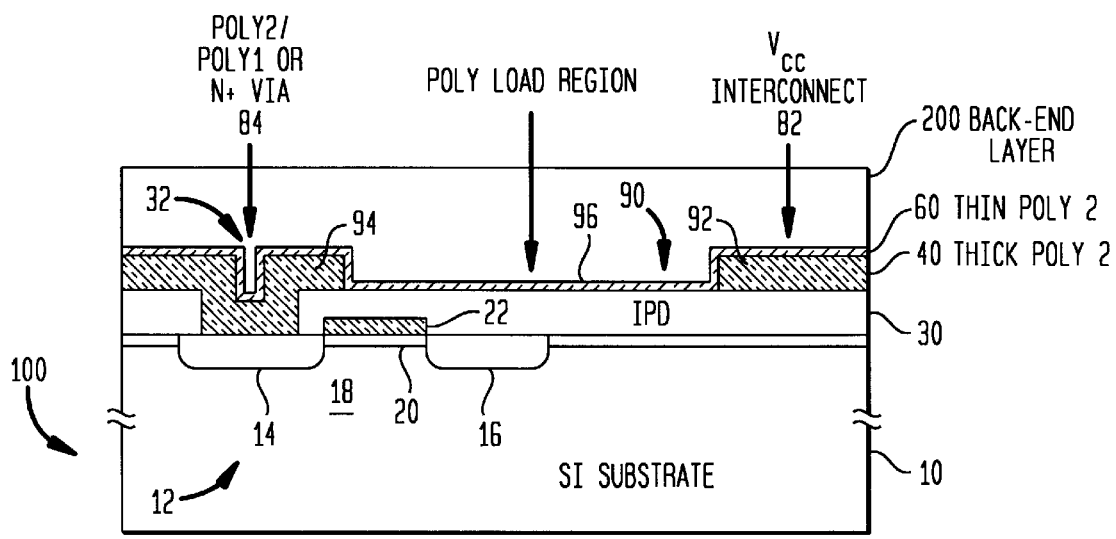

Then the poly-2 layer 40 and thin poly layer 60 are patterned to form the poly-load resistor 90 as shown in FIG. 8. The back end processes such as BPSG deposition, planarization, formation of metal contacts, etc. are not shown in detail and are schematically represented by the back end layer 200.

As shown in FIG. 8, the poly-load resistor 90, comprises a thick N+ type Vcc interconnect region 92, a thick driver interconnect region 94 (for connecting to the drain 14 of the driver through the via opening 32) and a thin poly-load region 96.

An SRAM cell formed using the structure 10 has a low Vcc interconnect resistance. In addition, the prior art problem of diffusion of impurities from the heavily doped interconnect regions to the low doped poly-load region is mitigated. The reason is that the thin poly layer (which forms the poly-load and also covers the thick interconnect regions) is uniformly doped so that there is not too much lateral diffusion within this layer. In addition, the thin polysilicon layer has fewer grain boundaries than a thick polysilicon layer so that there will be less lateral diffusion. Furthermore, to achieve the same resistance value in a thin poly-load region as in a thick poly-load region, the thin poly-load region has to have a higher dopant concentration. Thus, the thin poly-load region is less sensitive to the effects of lateral diffusion. It should also be noted that the number of mask steps used to form the inventive poly-load resistor structure is the same as used to form the conventional poly-load resistor structure.

Finally, the above-described embodiments of the invention are intended to be illustrative only. Numerous alternative embodiments may be devised by those skilled in the art without departing from the spirit and scope of the following claims.

We claim:

1. A method for forming a load resistance for an SRAM cell comprising the steps of:

(a) depositing an inter-poly-dielectric layer over a MOS driver device formed on a semiconductor substrate, and patterning said inter-poly-dielectric layer to form one or more via openings therein, (b) depositing a thick polysilicon layer on the surface of said inter-polydielectric layer, (c) uniformly doping said thick polysilicon layer with a first ion implantation, (d) patterning said thick polysilicon layer to form a driver interconnect region which connects to said driver device through said one or more via openings in said inter-poly-dielectric layer, and to form a supply voltage interconnect region, (e) depositing a thin polysilicon layer over said driver interconnect and supply voltage interconnect regions and over a portion of said inter-polydielectric layer between said driver interconnect and supply voltage interconnect regions, and (f) uniformly doping said thin polysilicon layer with a second ion implantation to form a load resistance region in electrical contact with said driver interconnect and supply voltage interconnect regions.

2. The method of claim 1, wherein said first ion implantation has a higher flux density than said second ion implantation so that said thick polysilicon layer has a higher dopant concentration than said thin polysilicon layer.

3. The method of claim 1, further comprising the step of patterning said thin polysilicon layer after said thin polysilicon layer is uniformly doped.

4. The method of claim 1, wherein said second ion implantation is performed utilizing arsenic atoms and said thin polysilicon layer is doped to be N-type.

5. The method of claim 1, wherein step (d) is performed utilizing $Cl_2$ as an etchant.

6. A method for forming a load resistance for an SRAM cell comprising the steps of:

(a) depositing an inter-poly-dielectric layer over a MOS driver device formed on a semiconductor substrate, and patterning said inter-poly-dielectric layer to form one or more via openings therein, (b) depositing a thick polysilicon layer on the surface of said inter-poly-dielectric layer, (c) patterning said thick polysilicon layer to form a driver interconnect region which connects to said driver device through said one or more via openings in said inter-poly-dielectric layer, and to form a supply voltage interconnect region, (d) depositing a thin polysilicon layer covering said driver interconnect and supply voltage interconnect regions and over a portion of said inter-poly-dielectric layer between said driver interconnect and supply voltage interconnect regions to form a load resistance region in electrical contact with said driver interconnect and supply voltage interconnect regions.

7. The method of claim 6, wherein step (d) further comprises the step of uniformly doping said thin polysilicon layer with an ion implantation.

8. The method of claim 7, further comprising the step of selecting said ion implantation to be performed utilizing arsenic ions.

9. The method of claim 8, further comprising the step of selecting said ion implantation to be performed at about 40 kev at a flux density of about $10^{14}/cm^2$.

10. The method of claim 7, wherein step (d) further comprises the step of selecting said thin polysilicon layer to be doped N-type.

11. The method of claim 6, further comprising the steps of:

uniformly doping said thick polysilicon layer with a first ion implantation after step (b), and uniformly doping said thin polysilicon layer with a second ion implantation after depositing said thin polysilicon layer.

12. A method for forming a load resistance for an SRAM cell comprising the steps of:

(a) depositing an inter-poly-dielectric layer over a MOS driver device formed on a semiconductor substrate, and patterning said inter-poly-dielectric layer to form one or more via openings therein, (b) depositing a thick polysilicon layer on the surface of said inter-poly-dielectric layer, (c) patterning said thick polysilicon layer to form a driver interconnect region which connects to said driver device through said one or more via openings in said inter-poly-dielectric layer, and to form a supply voltage interconnect region, (d) depositing a thin polysilicon layer over said driver interconnect and supply voltage interconnect regions and over a portion of said inter-poly- dielectric layer between said driver interconnect and supply voltage interconnect regions, and (e) doping said thin polysilicon layer with a first ion implantation to form a load resistance region in electrical contact with said driver interconnect and supply voltage interconnect regions.

13. The method of claim 12, further comprising the step of doping said thick polysilicon layer with a second ion implantation following step (b).

14. The method of claim 12, wherein said thin polysilicon layer is uniformly doped to reduce lateral diffusion of impurities.

15. The method of claim 12, wherein said thin polysilicon layer is doped N-type.

* * * * *